(12) United States Patent
Cohen et al.

(10) Patent No.: US 8,756,546 B2
(45) Date of Patent: Jun. 17, 2014

(54) ELASTIC MODULUS MAPPING OF A CHIP CARRIER IN A FLIP CHIP PACKAGE

(75) Inventors: Erwin B. Cohen, South Burlington, VT (US); Mark C. H. Lamorey, South Burlington, VT (US); Marek A. Orlowski, Fishkill, NY (US); Douglas O. Powell, Endicott, NY (US); David L. Questad, Hopewell Junction, NY (US); David B. Stone, Jericho, VT (US); Paul R. Walling, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/557,386

(22) Filed: Jul. 25, 2012

(65) Prior Publication Data
US 2014/0033148 A1   Jan. 30, 2014

(51) Int. Cl.
*G06F 17/50* (2006.01)

(52) U.S. Cl.
USPC .......................................... 716/112; 716/137

(58) Field of Classification Search
USPC .......... 716/112, 137; 257/700, 737, 778, 779; 438/118, 126, 127, 613
See application file for complete search history.

(56) References Cited

U.S. PATENT DOCUMENTS

| | | | |
|---|---|---|---|
| 3,871,015 A | | 3/1975 | Lin et al. |
| 5,270,571 A | * | 12/1993 | Parks et al. .................... 257/686 |
| 5,600,541 A | * | 2/1997 | Bone et al. .................... 361/707 |
| 5,953,814 A | | 9/1999 | Sozansky et al. |
| 6,229,209 B1 | * | 5/2001 | Nakamura et al. ............. 257/737 |
| 6,365,499 B1 | * | 4/2002 | Nakamura et al. ............. 438/613 |
| 6,399,896 B1 | | 6/2002 | Downes, Jr. et al. |
| 6,480,996 B1 | | 11/2002 | Aji et al. |
| 6,613,449 B2 | | 9/2003 | Yamaguchi et al. |
| 6,624,004 B2 | | 9/2003 | Lee |
| 6,630,837 B2 | | 10/2003 | Wark |
| 6,717,255 B2 | * | 4/2004 | Oggioni et al. ................ 257/690 |

(Continued)

FOREIGN PATENT DOCUMENTS

| | | |
|---|---|---|
| CN | 101872784 A | 10/2010 |
| JP | 11330010 A | 11/1999 |

(Continued)

OTHER PUBLICATIONS

Rahim, et al., "Fundamentals of Delamination Initiation and Growth in Flip Chip Assemblies," 2005 Electronic Components and Technology Conference, IEEE 2005, pp. 1172-1186.

(Continued)

*Primary Examiner* — Vuthe Siek
(74) *Attorney, Agent, or Firm* — Gibb & Riley, LLC; David A. Cain, Esq.

(57) ABSTRACT

A computer-implemented method provides an elastic modulus map of a chip carrier of a flip chip package. Design data including dielectric and conductive design elements of each of vertically aligned sub-areas of each of the layers of the chip carrier are modeled as springs to provide the elastic modulus map. Determining the elastic modulus of the sub-areas of the chip carrier identifies probable mechanical failure sites during chip-join and cools down of the flip chip package. Modifying a footprint of solder bumps to the chip carrier reduces stresses applied to the identified probable mechanical failure sites. Modifying the chip carrier design to reduce a stiffness of sub-areas associated with identified probable mechanical failure sites also reduces stresses from chip-join and cool-down.

5 Claims, 15 Drawing Sheets

(56) References Cited

U.S. PATENT DOCUMENTS

| | | |
|---|---|---|
| 6,883,153 B2 | 4/2005 | Jiang et al. |
| 6,981,230 B1 | 12/2005 | Lin et al. |
| 7,180,183 B2 | 2/2007 | Tsai et al. |
| 7,387,910 B2 | 6/2008 | Lee et al. |
| 7,456,047 B2 | 11/2008 | Mallik et al. |
| 7,543,254 B2 | 6/2009 | Xiu et al. |
| 7,670,876 B2 | 3/2010 | Tsai |
| 7,752,581 B2 | 7/2010 | Lanzerotti et al. |
| 7,802,220 B1 | 9/2010 | Popovich et al. |
| 7,805,258 B2 | 9/2010 | Fu et al. |
| 7,892,962 B2 | 2/2011 | Su |
| 7,937,674 B2 | 5/2011 | White et al. |
| 7,952,199 B2 | 5/2011 | Jo et al. |
| 8,039,971 B2 * | 10/2011 | Hosseini et al. ............ 257/779 |
| 8,214,773 B2 | 7/2012 | Lu et al. |
| 8,399,996 B2 * | 3/2013 | Hosseini et al. ............ 257/779 |
| 8,479,141 B1 | 7/2013 | Waller et al. |
| 2002/0042902 A1 | 4/2002 | Yamamoto et al. |
| 2003/0083856 A1 | 5/2003 | Yoshimura et al. |
| 2004/0025126 A1 | 2/2004 | Culler et al. |
| 2007/0120268 A1 * | 5/2007 | Irsigler et al. ............... 257/778 |
| 2007/0186206 A1 | 8/2007 | Abrams et al. |
| 2007/0244676 A1 | 10/2007 | Shang et al. |
| 2008/0054455 A1 | 3/2008 | Tsao et al. |
| 2008/0066023 A1 | 3/2008 | Xu et al. |
| 2008/0315413 A1 | 12/2008 | Yamano et al. |
| 2009/0044162 A1 | 2/2009 | Yoshioka |
| 2009/0075429 A1 | 3/2009 | Sato et al. |
| 2009/0083356 A1 | 3/2009 | Welkie |
| 2010/0006987 A1 | 1/2010 | Murugan et al. |
| 2010/0022085 A1 | 1/2010 | Goebel et al. |
| 2010/0205577 A1 | 8/2010 | Lu et al. |
| 2010/0243299 A1 | 9/2010 | Kariya et al. |
| 2011/0037179 A1 * | 2/2011 | Limaye et al. ............... 257/778 |
| 2011/0145772 A1 | 6/2011 | Pikus |
| 2011/0151627 A1 | 6/2011 | Graf et al. |
| 2011/0185326 A1 | 7/2011 | Ueda et al. |
| 2012/0036491 A1 | 2/2012 | Ramji et al. |
| 2012/0212375 A1 | 8/2012 | Depree |
| 2012/0290996 A1 | 11/2012 | Law et al. |
| 2013/0075869 A1 | 3/2013 | Mackh et al. |

FOREIGN PATENT DOCUMENTS

| | | |
|---|---|---|
| JP | 2000-269270 A | 9/2000 |
| JP | 2006-237470 | 9/2006 |
| JP | 2007-199961 A | 8/2007 |

OTHER PUBLICATIONS

Alcoe, et al., "A High Performance, Low Stress, Laminate Ball Grid Array Flip Chip Carrier," Semiconductor Packaging Technologies Symposium, SEMICON West 99, 1999, pp. 1-13.

Gadag, et al., "Numerical Prediction of Mechanical Properties of Pb-Sn Solder Alloys Containing Antimony, Bismuth and or Silver Ternary Trace Elements," Journal of Electronic Materials, vol. 29, No. 12, Dec. 2000, pp. 1392-1397.

Ernst, et al., "On the Effect of Cure-Residual Stress on Flip Chip Failure Prediction," Electronics Packaging Technology Conference, 2002, pp. 398-403.

Zhao, et al., "Prediction of Die Failure in copper-low-k Flip Chip Package with Consideration of Packaging Process-Induced Stresses," International Conference on Electronic Packaging Technology & High Density Packaging (ICEPT-HDP), 2009, pp. 322-326.

U.S. Appl. No. 13/677,373, filed Nov. 15, 2012, Office Action Communication, Aug. 22, 2013, 14 pages.

U.S. Appl. No. 13/677,373, filed Nov. 15, 2012, Notice of Allowance Communication, Sep. 24, 2013, 6 pages.

* cited by examiner

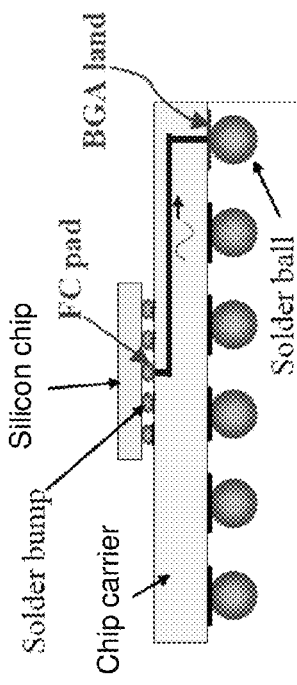
FIG. 1 – Related art
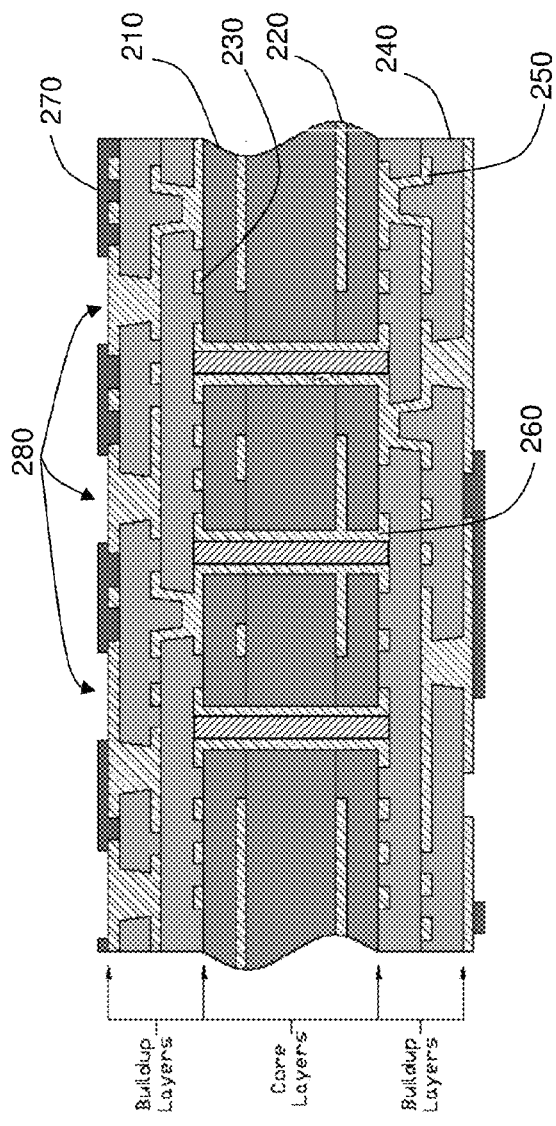
FIG. 2 – Related art

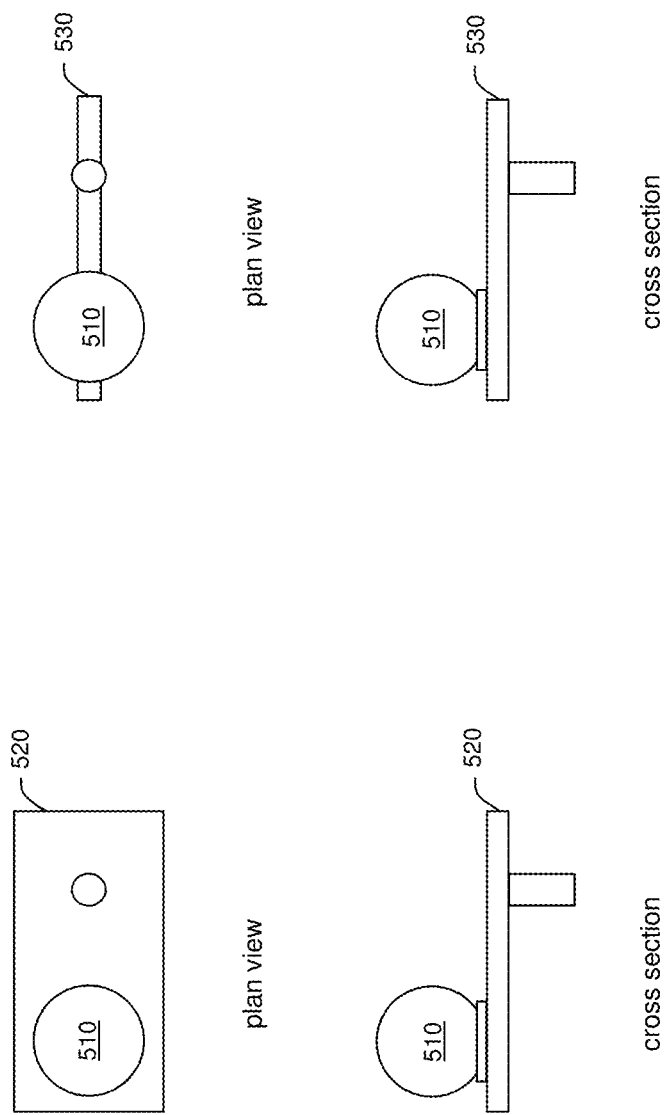

ELASTIC MODULUS MAPPING OF A CHIP CARRIER IN A FLIP CHIP PACKAGE

BACKGROUND

1. Field of Invention

The disclosure generally relates to chip package interactions (CPIs) between a chip carrier and a silicon chip in a flip chip ball grid array package. More particularly, the disclosure relates to providing an elastic modulus map of a chip carrier that identifies probable mechanical failure sites during chip join and cool-down of the flip chip package.

2. Description of Related Art

The semiconductor marketplace continues to demand smaller devices, which require greater connectivity densities for packaging design. The increased functionality of smaller semiconductor devices requires an increased number of signal, power, and ground connections, and a corresponding decrease in connection pitch is required to maintain reasonable chip size. The combination of these requirements results in greater complexity of semiconductor packaging design.

Referring to FIG. 1, the packaging design requirement is especially critical in flip chip ball grid array packages, where demand for a greater density of connections must coexist with good electrical and thermal reliability performance. When compared to other packaging technologies, flip chip packaging significantly increases the number of signal, power and ground connections of the silicon chip that are connected to the chip carrier through solder bumps or controlled collapse chip connections (C4s). During chip join and cool down, the solder bumps will form electrical and mechanical connections between flip chip (FC) pads on the surface of the chip carrier. In turn, the FC pads will electrically connect through various pathways of the chip carrier to, for example, ball grid array, lands and solder balls that connect to the system board.

FIG. 2 illustrates a cross section of a chip carrier, upon which FC pads have not yet been formed. The chip carrier usually includes one or more laminated core layers and several build-up layers. Each of the core layers includes a dielectric 210 and can include one or more conductive planes 220, such as metal fills, for power and ground. Core dielectrics can comprise any of ceramics, plastics and organic materials. Various core layers can also include conductive signal lines 230, such as metal signal lines. In some case, the core layers can be penetrated by a plated through hole via 260 that has a peripheral conductive metal layer, which surrounds a non-conductive epoxy resin core. The build-up layers also include a dielectric material 240 and can further include any of conductive planes and conductive signal lines. A laser-drilled or blind via 250 can penetrate a build-up layer. Upon adding finishing layers, FC pads can be located in areas 280 between insulators 270 formed on the outer surface of the build-up layer.

The mechanical stresses and strains that occur with chip package interactions (CPIs) are complex, depending upon many factors including chip carrier design, silicon chip design, process variations in chip carrier and silicon chip manufacture, and process variations in bond and assembly. Many CPIs result from stress/strain caused by a mismatch between the coefficients of thermal expansion (CTE) of the chip carrier and the silicon chip during the processes of heating the solder bumps or C4 connections to their melting point and the subsequent cooling of the joined chip carrier and silicon chip to an ambient temperature. Differences in contraction during chip-join and cool-down result in shear forces being applied between the chip carrier and the silicon chip. These shear forces are usually propagated as stress/strain through the solder bumps to an interface region of the solder bump with the silicon chip.

One type of chip package interaction (CPI) is a so-called "white bump" because of the white area produced on photographically processed acoustic images during test of the flip chip package. Each white bump corresponds to the location of a material fracture, i.e., a test failure, in the interface region between the solder bump and the silicon chip. White bumps typically occur during chip join and cool-down, or during subsequent handling of the flip chip package before an underfill is introduced between the chip carrier and the silicon chip to more uniformly distribute stresses across the chip carrier/silicon chip interface.

Experimental results indicate that white bumps are more likely to occur at sites associated with a greater shear force and/or a greater stiffness of materials. Mechanical analysis indicates that the shear forces produced at the FC pads on the chip carrier are proportional to a radial distance from a centrally neutral point on the chip carrier, i.e., a point that does not move with either thermal expansion or contraction of the chip carrier. The elastic modulus (Young's modulus) or the stiffness of the chip carrier depends on the stiffness of the layers comprising the chip carrier. Each layer, when viewed in a plan view, can vary in stiffness across its area, depending on the design elements e.g., dielectrics, power planes or fills, signal lines or wires, and vias, disposed within any of the layers of the chip carrier.

There remains a need for a method to identify those design elements of a chip carrier of a flip chip package that can contribute to possible "white bump" failures in the flip chip package, based on elastic modulus mapping of the design elements disposed within the chip carrier of the flip chip package, and to modify these design elements to decrease the probability of such "white bump" failures.

SUMMARY

In view of the foregoing, an exemplary embodiment disclosed herein provides a method for providing an elastic modulus map of a chip carrier of a flip chip package. The method may include loading design data for a chip carrier of the flip chip package that includes x, y, z coordinates of all design elements disposed within each of a number of layers, which are disposed under flip chip (FC) pads. The design elements may comprise any of a dielectric, a conductive plane, a conductive signal line, and a conductive via. The method may also include mapping a uniform square grid of sub-areas onto a plan view of each of the number of layers of the chip carrier, each of the sub-areas being defined by x, y coordinates. The method may further include determining a dielectric area and a conductive area for each of the sub-areas of each of the number of layers, based on the design data for any portions of the design elements disposed within each of the sub-areas. The method may yet further include determining for each of the sub-areas of each of the number of layers, an equivalent spring constant related to a first spring constant based on a first elastic modulus of the dielectric, the dielectric area, and a dielectric thickness from the z coordinate of the design data, and a second spring constant based on a second elastic modulus of the conductive material, the conductive area, and a conductive material thickness from the z coordinate of the design data. The method may yet further include accumulating each equivalent spring constant from each vertically aligned sub-area in each of the number of layers, to provide a combined spring constant for each of the sub-areas of the chip carrier. Finally, the method may include mapping each of the combined spring constants onto the uniform square grid of the chip carrier, to provide the elastic modulus map.

Another exemplary embodiment disclosed herein provides a method for identifying probable mechanical failure sites of a flip chip package from a chip carrier design. The method may include loading design data for the chip carrier of the flip chip package including: locations for each flip chip (FC) pad according to a uniform square grid of x, y coordinates of sub-areas applied to a plan view of the chip carrier, and x, y, z coordinates of all design elements disposed within each of the sub-areas of each of a number of layers, in which the design elements comprise any of a dielectric, a conductive plane, a conductive signal line, and a conductive via. The method may also include determining a first distance of each FC pad to a neutral point (DNP) of the chip carrier in the x, y coordinates, and determining at least one second distance for each FC pad along at least one of an x axis and a y axis of the uniform square grid to at least one edge of the chip carrier. The method may further include assigning a location score to each FC pad based on the first distance and the at least one second distance, and identifying each FC pad that exceeds a threshold location score in the design data with a probable mechanical failure site. The method may yet further include selecting a first grid area comprising a first number of sub-areas centered on each FC pad, assigning a first FC pad density score to each FC pad based on a number of FC pads in the first grid area, and identifying each FC pad with the first FC pad density score of less than a threshold first FC pad density score in the design data with a probable mechanical failure site. The method may yet further include determining a dielectric area and a conductive area for each of the sub-areas of each of the number of layers, based on the design data for any portions of the design elements disposed within each of the sub-areas. The method may yet further include determining for each of the sub-areas of each of the number of layers, an equivalent spring constant related to a first spring constant based on a first elastic modulus of the dielectric, the dielectric area, and a dielectric thickness from the z coordinate of the design data, and a second spring constant based on a second elastic modulus of the conductive material, the conductive area, and a conductive material thickness from the z coordinate of the design data. The method may yet further include accumulating each equivalent spring constant from each vertically aligned sub-area in each of the number of layers, to provide a combined spring constant for each of the sub-areas of the chip carrier. Finally, the method may include mapping each of the combined spring constants onto the uniform square grid of the chip carrier, and identifying each FC pad that is located in a sub-area of the chip carrier that exceeds a threshold combined spring constant in the design data with a probable mechanical failure site.

Yet another exemplary embodiment disclosed herein provides a method for modifying a flip chip package based on identifying probable mechanical failure sites in the flip chip package from a chip carrier design. The method may include loading design data for the chip carrier of the flip chip package including: locations for each flip chip (FC) pad according to a uniform square grid of x, y coordinates of sub-areas applied to a plan view of the chip carrier, and x, y, z coordinates of all design elements disposed within each of the sub-areas of each of a number of layers, in which the design elements comprise any of a dielectric, a conductive plane, a conductive signal line, and a conductive via. The method may also include determining a first distance of each FC pad to a neutral point (DNP) of the chip carrier in the x, y coordinates, and determining at least one second distance for each FC pad along at least one of an x axis and a y axis of the uniform square grid to at least one edge of the chip carrier. The method may further include assigning a location score to each FC pad based on the first distance and the at least one second distance, and identifying each FC pad that exceeds a threshold location score in the design data, as a probable mechanical failure site. The method may yet further include selecting a first grid area comprising a first number of sub-areas centered on each FC pad, assigning a first FC pad density score to each FC pad based on a number of FC pads in the first grid area, and identifying each FC pad with the first FC pad density score of less than a threshold first FC pad density score in the design data with a probable mechanical failure site. The method may yet further include determining a dielectric area and a conductive area for each of the sub-areas of each of the number of layers, based on the design data for any portions of the design elements disposed within each of the sub-areas. The method may yet further include determining for each of the sub-areas of each of the number of layers, an equivalent spring constant related to a first spring constant based on a first elastic modulus of the dielectric, the dielectric area, and a dielectric thickness from the z coordinate of the design data, and a second spring constant based on a second elastic modulus of the conductive material, the conductive area, and a conductive material thickness from the z coordinate of the design data. The method may yet further include accumulating each equivalent spring constant from each vertically aligned sub-area in each of the number of layers, to provide a combined spring constant for each of the sub-areas of the chip carrier. The method may yet further include mapping each of the combined spring constants onto the uniform square grid of the chip carrier, and identifying each FC pad that is located in a sub-area of the chip carrier that exceeds a threshold combined spring constant in the design data with a probable mechanical failure site. Finally, for each FC pad identified as a probable mechanical failure site, identifying an adjacent FC pad, which lacks a solder bump from a solder bump footprint of the flip chip package, and adding a solder bump to the adjacent FC pad in the flip chip package, to reduce shear forces propagated into the probable mechanical failure site.

Yet another exemplary embodiment disclosed herein provides a method for modifying a chip carrier design of a flip chip package based on identifying probable mechanical failure sites in the flip chip package from the chip carrier design. The method may include loading design data for the chip carrier of the flip chip package including: locations for each flip chip (FC) pad according to a uniform square grid of x, y coordinates of sub-areas applied to a plan view of the chip carrier, and x, y, z coordinates of all design elements disposed within each of the sub-areas of each of a number of layers, in which the design elements comprise any of a dielectric, a conductive plane, a conductive signal line, and a conductive via. The method may also include determining a first distance of each FC pad to a neutral point (DNP) of the chip carrier in the x, y coordinates, and determining at least one second distance for each FC pad along at least one of an x axis and a y axis of the uniform square grid to at least one edge of the chip carrier. The method may further include assigning a location score to each FC pad based on the first distance and the at least one second distance, and identifying each FC pad that exceeds a threshold location score in the design data with a probable mechanical failure site. The method may yet further include selecting a first grid area comprising a first number of sub-areas centered on each FC pad, assigning a first FC pad density score to each FC pad based on a number of FC pads in the first grid area, and identifying each FC pad with the first FC pad density score of less than a threshold first FC pad density score in the design data with a probable mechanical failure site. The method may yet further include determining a dielectric area and a conductive area for each of the sub-areas of each of the number of layers, based on the design data for any portions of the design elements disposed within each of the sub-areas. The method may yet further include determining for each of the sub-areas of each of the number of layers, an equivalent spring constant related to a first spring constant based on a first elastic modulus of the dielectric, the dielectric area, and a dielectric thickness from the z coordinate of the design data, and a second spring constant based on a second elastic modulus of the conductive material, the conductive area, and a conductive material thickness from the z coordinate of the design data. The method may yet further include accumulating each equivalent spring constant from each vertically aligned sub-area in each of the number of layers, to provide a combined spring constant for each of the sub-areas of the chip carrier. The method may yet further include mapping each of the combined spring constants onto the uniform square grid of the chip carrier, and identifying each FC pad that is located in a sub-area of the chip carrier that exceeds a threshold combined spring constant in the design data with a probable mechanical failure site. Finally, for each of the sub-areas of the chip carrier design associated with and surrounding each FC pad identified as a probable mechanical failure site, modifying the chip carrier design by decreasing a value of the combined spring constants for the sub-areas associated with and surrounding each FC pad identified as a probable mechanical failure site, to reduce a stiffness of the chip carrier.

BRIEF DESCRIPTION OF THE DRAWINGS

Exemplary embodiments of the disclosures herein will be better understood from the following detailed description with reference to the drawings, which are not necessarily drawn to scale and in which:

FIG. 1 is a schematic diagram illustrating a cross section of a flip chip package in the related art;

FIG. 2 is a schematic diagram illustrating a cross section of a chip carrier used in a flip chip package in the related art;

FIG. 5A is a schematic diagram illustrating a plan view of a solder bump 510 to a conductive plane 520 in an underlying layer of the chip carrier in an exemplary embodiment;

FIG. 5B is a schematic diagram illustrating a plan view of a solder bump 510 to a conductive wire 530 in an underlying layer of the chip carrier in an exemplary embodiment;

DETAILED DESCRIPTION

Figure 3B:
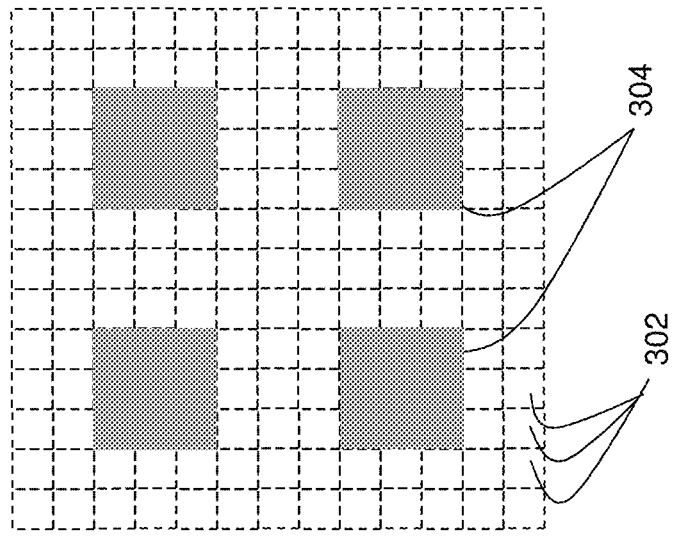
FIG. 3B is a schematic diagram illustrating a plan view that shows laminate contact pads 304 centered above 3×3 grids of sub-areas 302 of a chip carrier in an exemplary embodiment.

The exemplary embodiments of the disclosure and their various features and advantageous details are explained more fully with reference to the non-limiting exemplary embodiments that are illustrated in the accompanying drawings and detailed in the following description. It should be noted that the features illustrated in the drawings are not necessarily drawn to scale. Descriptions of well-known materials, components, and processing techniques are omitted so as to not unnecessarily obscure the exemplary embodiments of the disclosure. The examples are intended to merely facilitate an understanding of ways in which the exemplary embodiments of the disclosure may be practiced and to further enable those of skill in the art to practice the exemplary embodiments. Accordingly, the examples should not be construed as limiting the scope of the exemplary embodiments of the disclosure.

As described above, there remains a need for a method to identify those design elements of a chip carrier of a flip chip package that can contribute to possible "white bump" failures in the flip chip package, based on elastic modulus mapping of the design elements disposed within the chip carrier of the flip chip package, and to modify these design elements to decrease the probability of such "white bump" failures.

White bumps are more likely to occur where greater shear forces are propagated between the interface of the chip carrier and the silicon chip, and where materials of the chip carrier possess a greater mechanical stiffness. Mechanical analysis indicates that the shear forces generated between the chip carrier and the silicon chip may be proportional to a radial distance from a centrally located neutral point of the chip carrier. A solder bump footprint or C4 footprint of a chip carrier design may identify those sites where a solder bump is to be formed in a flip chip package. The elastic modulus (Young's modulus) or the stiffness of the chip carrier may depend on the stiffness of the layers comprising the chip carrier.

When viewed in a plan view, a uniform square grid comprising a number of sub-areas may divide each layer of the chip carrier. Each layer may vary in stiffness across its sub-areas, depending on the location of any design elements, e.g., dielectrics, conductive planes or fills, conductive signal lines, and conductive vias. The conductive vias may comprise any of through hole vias, microvias, blind vias, and filled drill holes. The x, y coordinates of various design elements for each sub-area of each layer may be known from the software layout of the chip carrier design. Likewise, the thickness of any design element may be known from the z coordinate of the chip carrier design.

Figure 3A:
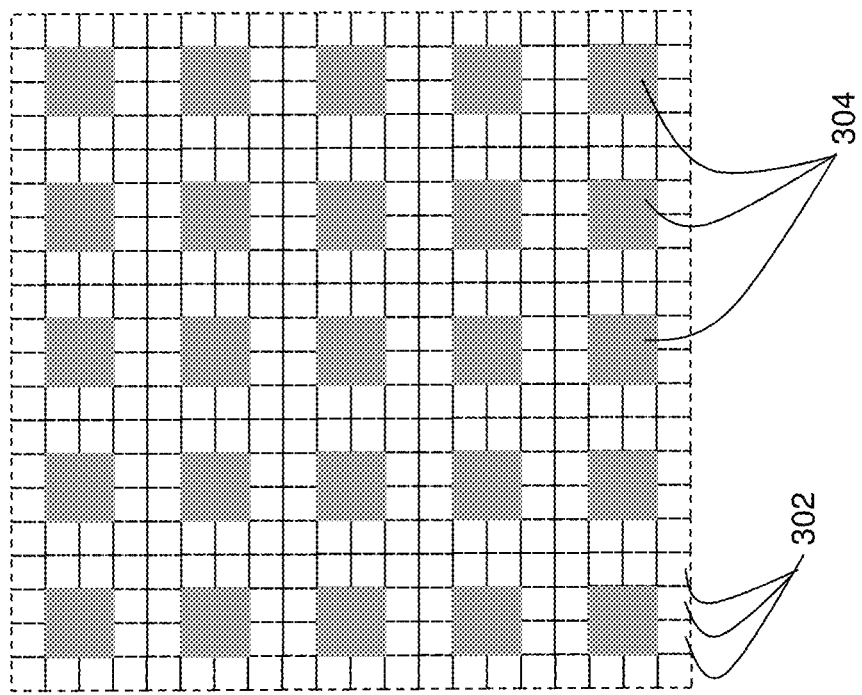
FIG. 3A is a schematic diagram illustrating a plan view that shows laminate contact pads 304 centered above 2×2 grids of sub-areas 302 of a chip carrier in an exemplary embodiment.

Referring to FIGS. 3A and 3B, an exemplary chip carrier, as viewed in a plan view, may be divided into a uniform square grid comprising a number of sub-areas, 302. Each flip chip (FC) pad 304 may be centered on, for example, one of a 2×2 square grid of sub-areas 302 as shown in FIG. 3A, and a 3×3 square grid of sub-areas 302 as shown in FIG. 3B. In a cross section of the chip carrier, each of the sub-areas may be vertically aligned through all the layers of the chip carrier.

The design elements of each layer may also be characterized by one or more values of an elastic modulus. For example, one elastic modulus value may be associated with a particular dielectric material, used in a particular layer, while another elastic modulus value may be associated with a particular conductive material, such as a metal, used in any of a conductive plane, a conductive signal line, and a conductive via in the particular layer.

An elastic modulus map may be created that identifies those FC pads, which are likely to be associated with white bumps, by using the estimated shear forces of the chip package interactions (CPIs) at the FC pads, the x, y, z coordinates of the design elements provided by the software layout, and the elastic modulus of each material of the design elements comprising the sub-areas of each layer underlying each FC pad. The elastic modulus of a material may relate to the force that generates a possible fracture in the material under a given strain, $$F=-(EA\Delta L)/L_0,$$

where E is the modulus of elasticity, F is the force exerted on the material under tension, A is the original cross-sectional area through which the force is applied, $\Delta L$ is the amount by which the length of the object changes, and $L_0$ is the original length of the object. This formula may then be used to model the material as an ideal spring that obeys Hooke's law, as follows, $$F=-(EA/L_0)\Delta L=-kx,$$

where the factor $-(E A/L_0)$ is equated to the spring constant $-k$, and $\Delta L$ is equated to the change in length of the spring, x.

Figure 4:
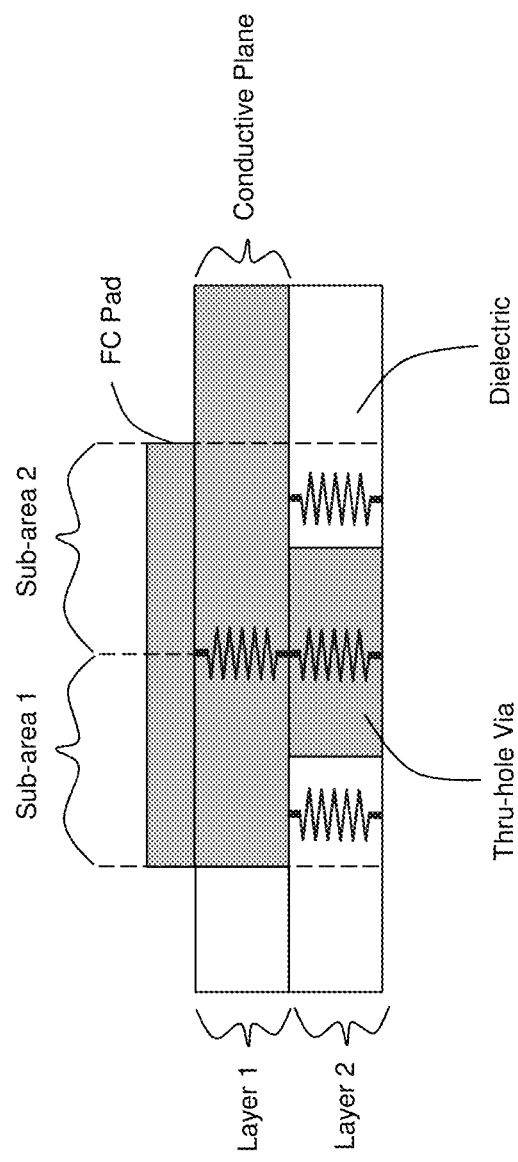
FIG. 4 is a schematic diagram illustrating a cross section of a portion of a chip carrier that is mechanically modeled by springs in an exemplary embodiment.

Referring to FIG. 4, two sub-areas of two layers of a portion of an exemplary chip carrier may be mapped above a cross section of an FC pad. In the first layer, each of the two sub-areas directly contacting the overlying FC pad may, for example, comprise only the material of a conductive plane. In this case, the dielectric material area of each of the two sub-areas may equal zero, while the conductive material area of each of the two sub-areas may equal that of each sub-area of the uniform grid. The second layer underlying the conductive plane of the first layer may, for example, include a through hole via, which is apportioned between each of the two sub-areas. Each portion of the through hole via, corresponding to each of the two sub-areas, may be modeled by a spring using the elastic modulus for the via's material and the x, y, z coordinates of the through hole via from the layout design data for the second layer. Likewise, each portion of the dielectric, corresponding to each one of the two sub-areas of the second layer, may be modeled by a spring using the elastic modulus of the dielectric and the x, y, z coordinates of each portion of the dielectric in the second layer. In FIG. 4, each of the two sub-areas of the second layer may comprise, for example, a dielectric material area equal to ½ of each sub-area and a conductive material area, i.e., an area of the conductive material for the via, equal to ½ of each sub-area. Thus, a single sub-area of each layer may comprise a single dielectric area resulting from the accumulation of any dielectric design elements in the single sub-area, and a single conductive area resulting from the accumulation of any conductive design elements in the single sub-area.

When modeling a spring for a single sub-area of a layer comprising a dielectric area and a conductive area, the individual springs modeling the dielectric area and the conductive area of a single sub-area may be considered to be in parallel. Thus, the spring constants for the dielectric area, $k_{dielectric}$, and for the conductive area, $k_{conductive}$, may be added to obtain a single equivalent spring constant, $k_{eq}$, for the single sub-area. When modeling a spring for a single sub-area across a number of vertically stacked layers of the chip carrier, the single equivalent spring constants for each of the vertically stacked layers may be considered to be in series and may be combined according to: $1/k_{com}=1/k_1+1/k_2+\ldots +k_n$, where $k_{com}$ represents a combined spring constant for a single sub-area that extends through n layers of the chip carrier, and subscripts 1 ... n identify the layer associated with each of the single equivalent spring constants. In various exemplary embodiments, a limited number of layers underlying each FC pad may be analyzed with respect to an elastic modulus map, because only those layers nearest the FC pad will impact the stiffness underlying each FC pad.

Where shear forces are great, or the combined spring constants of the sub-areas that underlie a particular FC pad are relatively stiff, the design of the flip chip package may be modified, respectively, to reduce the shear forces or to reduce the stiffness of the underlying sub-areas. Thus, the probability of a fracture, and a "white bump" failure, within the flip chip package may be lessened.

Figure 6B:
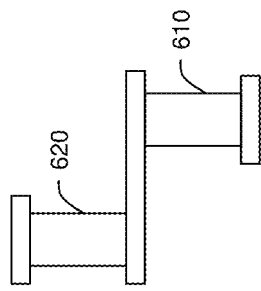
FIG. 6B is a schematic diagram illustrating a cross section of two horizontally staggered vias 610 620 in two adjacent layers of the chip carrier in an exemplary embodiment.
Figure 7B:
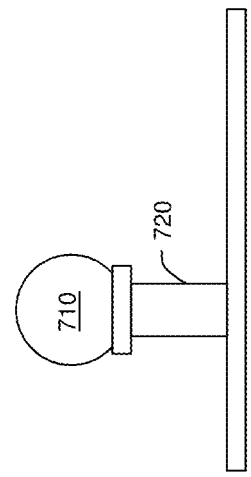
FIG. 7B is a schematic diagram illustrating a cross section of a solder bump 710 that is horizontally staggered with an underlying via 720 of the chip carrier in an exemplary embodiment.
Figure 6A:
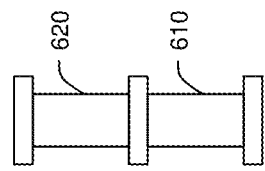
FIG. 6A is a schematic diagram illustrating a cross section of two vertically aligned vias 610 620 in two adjacent layers of the chip carrier in an exemplary embodiment.
Figure 7A:
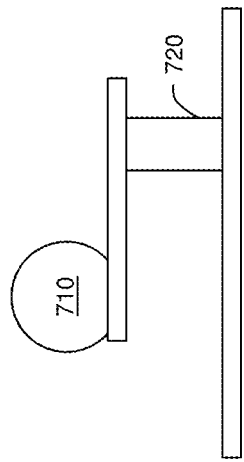
FIG. 7A is a schematic diagram illustrating a cross section of a solder bump 710 that is vertically aligned with an underlying via 720 of the chip carrier in an exemplary embodiment.

A chip package interaction (CPI) stress transmitted by a solder bump, which has a high probability of being associated with a "white bump" failure, may be reduced by adding a neighboring solder bump to the existing solder bump footprint of the flip chip package. During chip join and cooldown, the stress/strain generated by shear forces may be "shared" by adding a neighboring solder bump. The disposition of at least two neighboring solder bumps to the solder bump footprint of the flip chip package, where there had previously been but one solder bump, results in reducing the stress/strain propagated by each of the at least two neighboring solder bumps, relative to the stress/strain that had previously been applied to the one existing solder bump.

Where the shear forces are relatively high, and the combined spring constants of sub-areas that underlie an FC pad for the particular solder bump are relatively stiff, the stiffness of the sub-areas may be "softened" by reducing the elastic modulus of design elements within the underlying layers of the sub-areas. In FIG. 5A, for example, a solder bump 510 that overlies a sub-area of a layer that includes a conductive plane 520 may be mechanically "isolated" from the relative stiffness of the conductive plane by replacing the conductive plane 520 with a conductive wire 530, as shown in FIG. 5B, that exhibits greater compliance. In addition, the relative stiffness of at least two stacked conductive vias 610, 620, as shown in FIG. 6A, may be "softened" by horizontally staggering the first conductive via 610 in a first layer relative to the second conductive via 620 in a second layer, as shown in FIG. 6B. Similarly, as shown in FIG. 7A, a solder bump 710 under which a conductive via 720 is stacked may be "softened" by horizontally staggering the conductive via 720 relative to solder bump 710 with a compliant conductive design element.

Increasing the area of an FC pad, to which a solder bump is attached, may also reduce CPI stresses, because the stress/strain to an individual FC pad may be spread over a larger area. Alternatively, decreasing the volume of an individual solder bump, connected to an FC pad, may result in a smaller cross-sectional area for an elongated solder bump connecting the FC pad to the silicon chip. The smaller cross-sectional area of the elongated solder bump may require less force to plastically deform and elongate the solder bump. This plastic deformation may reduce the stress/strain propagated by the elongated solder bump to the interface region of the solder bump and silicon chip during chip join and cool-down, and may reduce the probability of white bumps.

Figure 8:
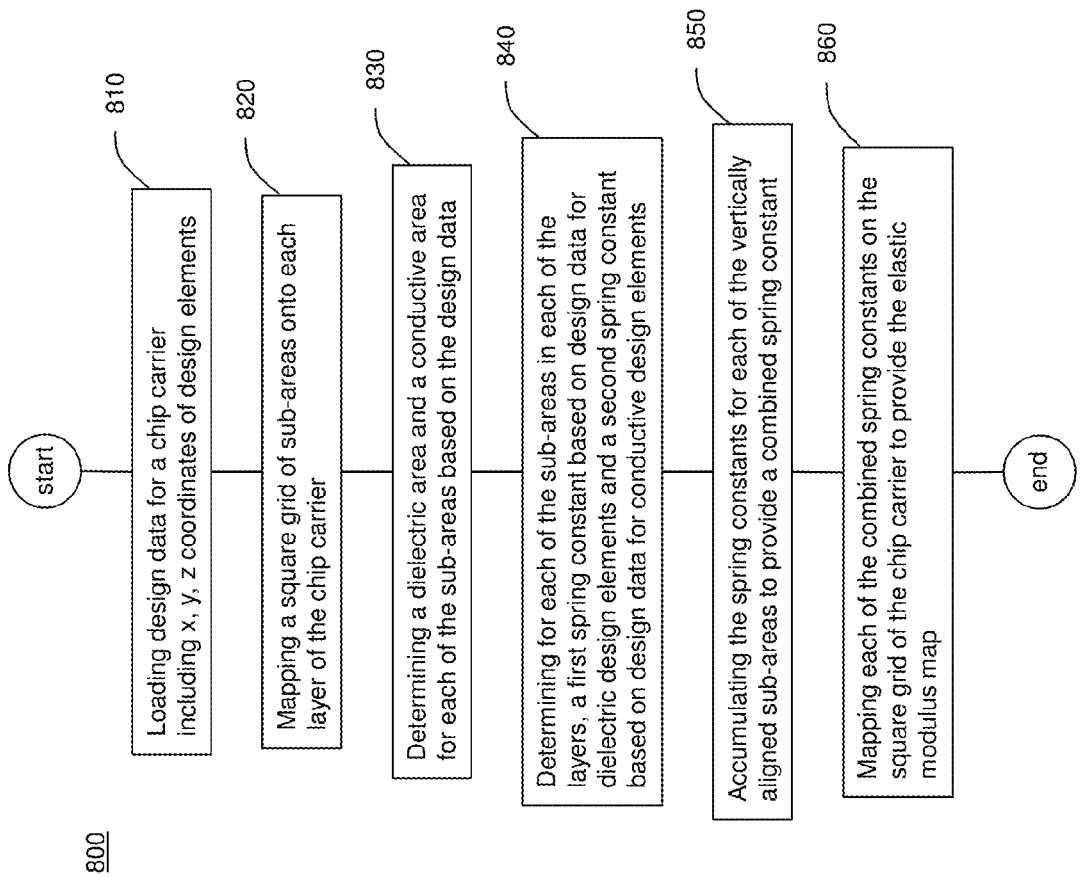
FIG. 8 is a flow chart 800 illustrating a method for providing an elastic modulus map of a chip carrier of a flip chip package in an exemplary embodiment.

Referring to FIG. 8, flow chart 800 illustrates an exemplary embodiment of a computer-implemented method for providing an elastic modulus map of a chip carrier of a flip chip package. The method may include loading design data from a software layout program for the chip carrier that includes the x, y, z coordinates of all design elements disposed within each of a number of layers, which are stacked under the FC pads 810. The design elements may include any of a dielectric, a conductive plane, a conductive signal line, and a conductive via. The design data may also include the elastic modulus for any dielectric material and for any conductive material used in the design elements. The method may also include mapping, in a plan view, a uniform square grid of sub-areas onto each of the number of layers of the chip carrier, 820. The x, y coordinates used by the software layout program, may define each of the sub-areas. The method may further include determining a dielectric area and a conductive area for each of the sub-areas of each of the number of layers of the chip carrier, based on the design data for any portions of the design elements, comprising either a dielectric material or a conductive material, disposed within each of the sub-areas, 830. The method may yet further include determining for each of the sub-areas of each of the number of layers, an equivalent spring constant related to a first spring constant based on a first elastic modulus value of the dielectric material found in the dielectric area of each sub-area and a dielectric thickness provided by the z coordinate of the dielectric material from the design data, and a second spring constant based on a second elastic modulus value of the conductive material found in the conductive area of each sub-area and a conductive thickness provided by the z coordinate of the conductive material from the design data, 840. The method may yet further include accumulating each equivalent spring constant from each vertically aligned sub-area in each of the number of layers of the chip carrier, to provide a combined spring constant for each of the sub-areas of the chip carrier, 850. Finally, the method may include mapping each of the combined spring constants onto the uniform square grid of the chip carrier, to provide the elastic modulus map for the chip carrier, 850.

The method of providing an elastic modulus map for a chip carrier design of a flip chip package, described above, may be used in conjunction with the estimated shear forces transmitted to the individual FC pads of the chip carrier during chip-join and cool-down, to identify FC pads that may be associated with probable "white bump" failures of the flip chip package, 860.

Figure 9:
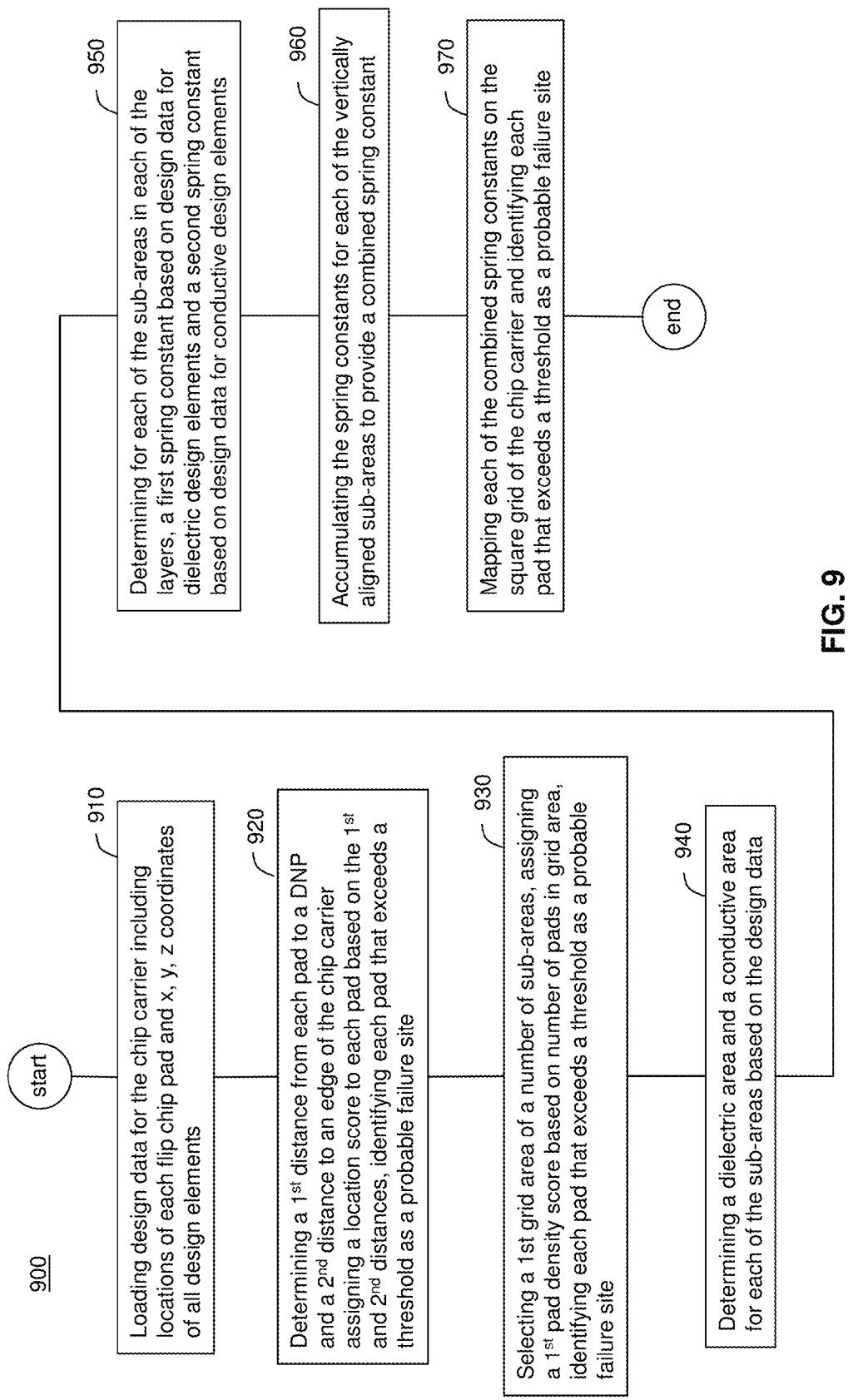
FIG. 9 is a flow chart 900 illustrating a method for identifying probable mechanical failure sites of a flip chip package from a chip carrier design of the flip chip package in an exemplary embodiment.

Referring to FIG. 9, flow chart 900 illustrates an exemplary embodiment of a computer-implemented method for identifying probable mechanical failure sites of a flip chip package from a chip carrier design. The method may include loading design data for the chip carrier of the flip chip package, 910. The design data may include locations for each flip chip (FC) pad according to a uniform square grid of x, y coordinates of sub-areas applied to a plan view of the chip carrier. The design data may also include the x, y, z coordinates of all design elements disposed within each of the sub-areas of each of a number of layers of the chip carrier, where the design elements may comprise any of a dielectric, a conductive plane, a conductive signal line, and a conductive via.

The method may also include determining a first distance from the x, y coordinates for each FC pad to a neutral point, i.e., a distance to neutral point (DNP), of the chip carrier, and determining at least one second distance for each FC pad along at least one of an x axis and a y axis of the uniform square grid to at least one edge of the chip carrier, 920. The method may further include assigning a location score to each FC pad based on the first distance to the DNP and the second distance(s) along either the x-axis, the y-axis, or the x and y axes, to an edge of the chip carrier. The method may yet further include identifying each FC pad that exceeds a threshold location score in the design data with a probable mechanical failure site.

The method may also include centering each of the FC pads on one of: a 2×2 grid of sub-areas of the uniform square grid applied to the chip carrier, and a 3×3 grid of sub-areas of the uniform square grid applied to the chip carrier.

The method may also include selecting a local grid area comprising a relatively smaller number of sub-areas centered on each FC pad, and assigning a local FC pad density score to each FC pad based on the number of FC pads located within the local grid area, 930. Each FC pad having a local FC pad density score of less than a threshold local FC pad density score may be identified in the design data with a probable mechanical failure site.

Similarly, the method may also include selecting a global grid area comprising a relatively larger number of sub-areas centered on each FC pad, and assigning a global FC pad density score to each FC pad based on the number of FC pads located within the global grid area. Each FC pad having a global FC pad density score of less than a threshold global FC pad density score may be identified in the design data with a probable mechanical failure site.

The method may also include determining a dielectric area and a conductive area for each of the sub-areas of each of the number of layers, based on the x, y, z coordinates from the design data for any portions of the design elements that are located within each of the sub-areas in each of the number of layers of the chip carrier, 940. The method may further include determining for each of the sub-areas of each of the number of layers of the chip carrier, an equivalent spring constant related to a first spring constant based on a first elastic modulus of the dielectric, the determined dielectric area, and a dielectric thickness from the z coordinate of the design data, and a second spring constant based on a second elastic modulus of the conductive material, the determined conductive area, and a conductive material thickness from the z coordinate of the design data, 950. The conductive design elements from the design data may include any of a conductive plane, e.g., a voltage plane, a conductive signal line, e.g., a copper signal line, and a conductive via, e.g., a metal-filled via.

The method may also include accumulating each equivalent spring constant from each vertically aligned sub-area in each of the number of layers of the chip carrier, to provide a combined spring constant for each of the sub-areas of each of the number of layers for the chip carrier, 960. The method may then further include mapping each of the combined spring constants onto the uniform square grid applied to the chip carrier, and identifying each FC pad that is located in a sub-area of the chip carrier which exceeds a threshold combined spring constant in the design data with a probable mechanical failure site, 970.

Additionally, the method may include determining a cumulative score for each of the sub-areas of each of the number of layers of the chip carrier, based on the location score, the local FC pad density score, and the combined spring constant, and identifying each FC pad that is located in a sub-area of the chip carrier that exceeds a threshold cumulative score in the design data with a probable mechanical failure site.

Furthermore, the method may include determining gradients of the combined spring constants between each of the sub-areas and each of the sub-areas adjacent to each of the sub-areas in said uniform square grid. The method may further include assigning a maximal gradient score based on an absolute difference between each of the sub-areas and the sub-areas adjacent to each of the sub-areas. The method may yet further include identifying each FC pad that is located in a sub-area of the chip carrier that exceeds a threshold maximal gradient score in the design data with a probable mechanical failure site.

The method for identifying probable mechanical failure sites of a flip chip package from a chip carrier design, described above, may be used in conjunction with a process of modifying a solder bump footprint of the flip chip package, to reduce the shear forces transmitted to probable mechanical failure sites.

Figure 10:
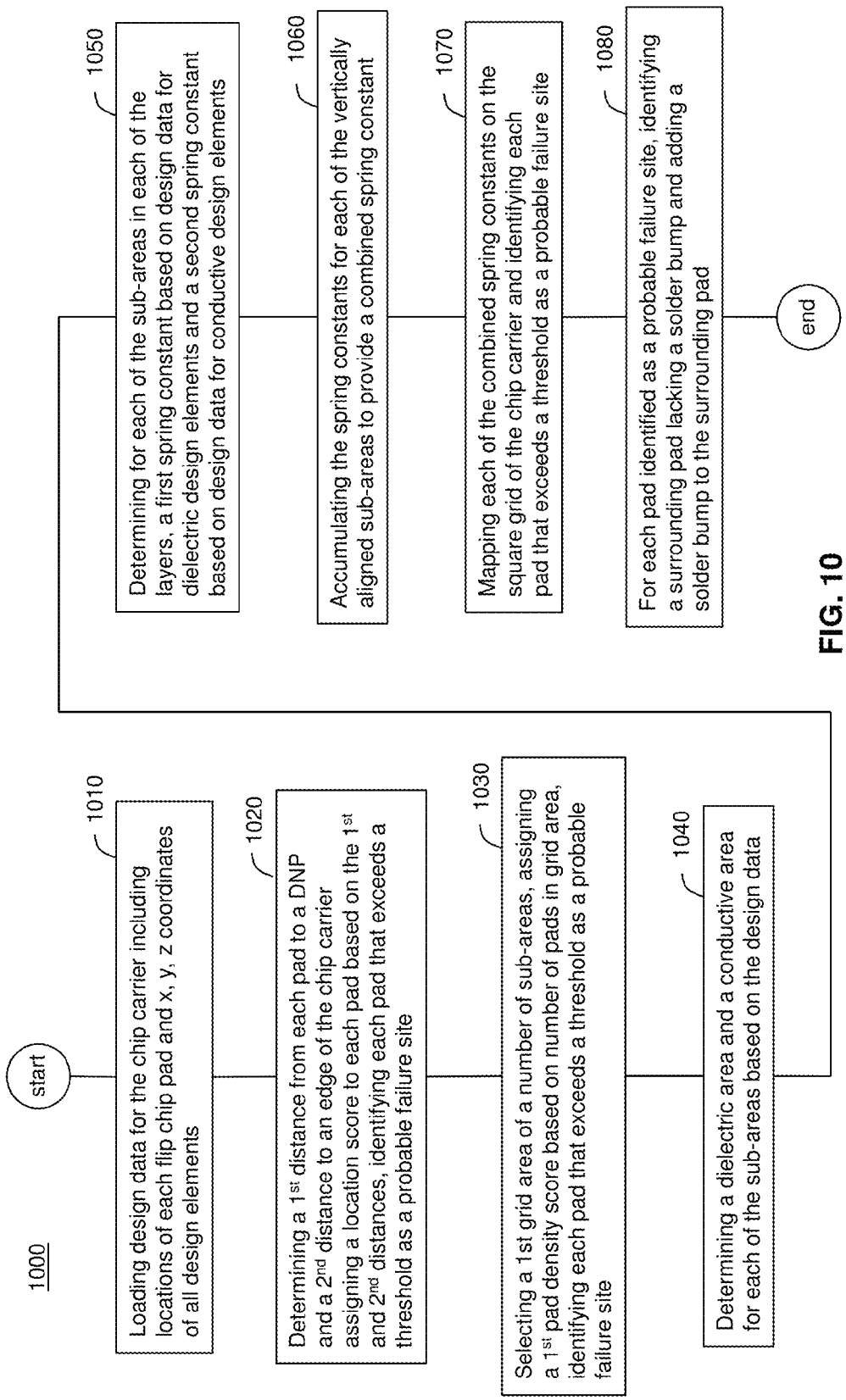
FIG. 10 is a flow chart 1000 illustrating a method for modifying a flip chip package based on identifying probable mechanical failure sites in the existing flip chip package from a chip carrier design in an exemplary embodiment.

Referring to FIG. 10, flow chart 1000 illustrates an exemplary embodiment of a computer-implemented method for modifying a flip chip package based on identifying probable mechanical failure sites in the flip chip package from a carrier chip design. The method may include loading design data for the chip carrier of the flip chip package, 1010. The design data may include locations for each flip chip (FC) pad according to a uniform square grid of x, y coordinates of sub-areas applied to a plan view of the chip carrier. The design data may also include the x, y, z coordinates of all design elements disposed within each of the sub-areas of each of a number of layers of the chip carrier, where the design elements may comprise any of a dielectric, a conductive plane, a conductive signal line, and a conductive via.

The method may also include determining a first distance from the x, y coordinates for each FC pad to a neutral point, i.e., a distance to neutral point (DNP), of the chip carrier, and determining at least one second distance for each FC pad along at least one of an x axis and a y axis of the uniform square grid to at least one edge of the chip carrier, 1020. The method may further include assigning a location score to each FC pad based on the first distance to the DNP and the second distance(s) along either the x-axis, the y-axis, or the x and y axes, to an edge of the chip carrier. The method may yet further include identifying each FC pad that exceeds a threshold location score in the design data with a probable mechanical failure site.

The method may also include centering each of the FC pads on one of: a 2×2 grid of sub-areas of the uniform square grid applied to the chip carrier, and a 3×3 grid of sub-areas of the uniform square grid applied to the chip carrier.

The method may also include selecting a local grid area comprising a relatively smaller number of sub-areas centered on each FC pad, and assigning a local FC pad density score to each FC pad based on the number of FC pads located within the local grid area, 1030. Each FC pad having a local FC pad density score of less than a threshold local FC pad density score may be identified in the design data with a probable mechanical failure site.

Similarly, the method may also include selecting a global grid area comprising a relatively larger number of sub-areas centered on each FC pad, and assigning a global FC pad density score to each FC pad based on the number of FC pads located within the global grid area. Each FC pad having a global FC pad density score of less than a threshold global FC pad density score may be identified in the design data with a probable mechanical failure site.

The method may also include determining a dielectric area and a conductive area for each of the sub-areas of each of the number of layers, based on the x, y, z coordinates from the design data for any portions of the design elements that are located within each of the sub-areas in each of the number of layers of the chip carrier, 1040. The method may further include determining for each of the sub-areas of each of the number of layers of the chip carrier, an equivalent spring constant related to a first spring constant based on a first elastic modulus of the dielectric, the determined dielectric area, and a dielectric thickness from the z coordinate of the design data, and a second spring constant based on a second elastic modulus of the conductive material, the determined conductive area, and a conductive material thickness from the z coordinate of the design data, 1050. The conductive design elements from the design data may include any of a conductive plane, e.g., a voltage plane, a conductive signal line, e.g., a copper signal line, and a conductive via, e.g., a metal-filled via.

The method may also include accumulating each equivalent spring constant from each vertically aligned sub-area in each of the number of layers of the chip carrier, to provide a combined spring constant for each of the sub-areas of each of the number of layers for the chip carrier, 1060. The method may then further include mapping each of the combined spring constants onto the uniform square grid applied to the chip carrier, and identifying each FC pad that is located in a sub-area of the chip carrier that exceeds a threshold combined spring constant in the design data with a probable mechanical failure site, 1070.

For each FC pad identified with a probable mechanical failure site by the processes described above, the method may also include identifying an adjacent FC pad, which lacks a solder bump from a solder bump footprint of the flip chip package, and subsequently, adding a solder bump to the adjacent FC pad in the flip chip package, to reduce shear forces propagated into the probable mechanical failure site, 1080.

Alternatively, for each FC pad identified with a probable mechanical failure site by the processes described above, the method may also include increasing an area of the identified FC pad to allow for a solder bump of a greater diameter, so as to spread the CPI stresses over a larger area and reduce a probability of a mechanical failure. The method may also allow for a smaller cross-sectional area for an elongated solder bump connecting the identified FC pad to the semiconductor chip, in which the smaller cross-sectional area of the elongated solder bump requires less force to plastically deform and elongate the solder bump.

Additionally, the method may include determining a cumulative score for each of the sub-areas of each of the number of layers of the chip carrier, based on the location score, the local FC pad density score, and the combined spring constant, and identifying each FC pad that is located in a sub-area of the chip carrier that exceeds a threshold cumulative score in the design data with a probable mechanical failure site.

Furthermore, the method may include determining gradients of the combined spring constants between each of the sub-areas and each of the sub-areas adjacent to each of the sub-areas in said uniform square grid. The method may further include assigning a maximal gradient score based on an absolute difference between each of the sub-areas and the sub-areas adjacent to each of the sub-areas. The method may yet further include identifying each FC pad that is located in a sub-area of the chip carrier that exceeds a threshold maximal gradient score in the design data with a probable mechanical failure site.

Figure 11:
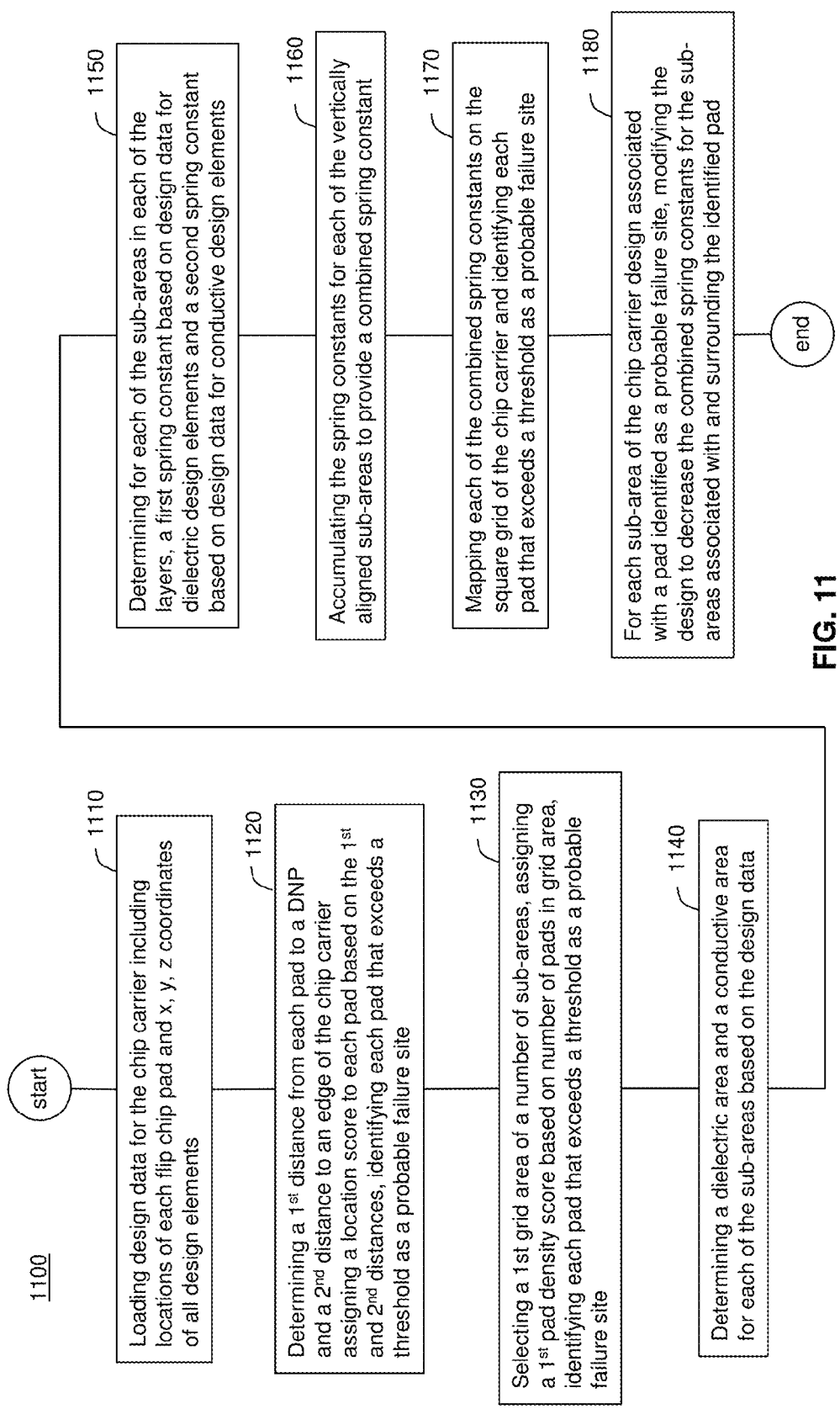
FIG. 11 is a flow chart 1100 illustrating a method for modifying a chip carrier design of a flip chip package based on identifying probable mechanical failure sites in the flip chip package from the existing chip carrier design in an exemplary embodiment.

Referring to FIG. 11, flow chart 1100 illustrates another exemplary embodiment of a computer-implemented method for modifying a chip carrier design of a flip chip package based on identifying probable mechanical failure sites in the flip chip package from the chip carrier design. The method may include loading design data for the chip carrier of the flip chip package, 1110. The design data may include locations for each flip chip (FC) pad according to a uniform square grid of x, y coordinates of sub-areas applied to a plan view of the chip carrier. The design data may also include the x, y, z coordinates of all design elements disposed within each of the sub-areas of each of a number of layers of the chip carrier, where the design elements may comprise any of a dielectric, a conductive plane, a conductive signal line, and a conductive via.

The method may also include determining a first distance from the x, y coordinates for each FC pad to a neutral point, i.e., a distance to neutral point (DNP), of the chip carrier and determining at least one second distance for each FC pad along at least one of an x axis and a y axis of the uniform square grid to at least one edge of the chip carrier, 1120. The method may further include assigning a location score to each FC pad based on the first distance to the DNP and the second distance(s) along either the x-axis, the y-axis, or the x and y axes, to an edge of the chip carrier. The method may yet further include identifying each FC pad that exceeds a threshold location score in the design data with a probable mechanical failure site.

The method may also include centering each of the FC pads on one of: a 2×2 grid of sub-areas of the uniform square grid applied to the chip carrier, and a 3×3 grid of sub-areas of the uniform square grid applied to the chip carrier.

The method may also include selecting a local grid area comprising a relatively smaller number of sub-areas centered on each FC pad, and assigning a local FC pad density score to each FC pad based on the number of FC pads located within the local grid area, 1130. Each FC pad having a local FC pad density score of less than a threshold local FC pad density score may be identified in the design data with a probable mechanical failure site.

Similarly, the method may also include selecting a global grid area comprising a relatively larger number of sub-areas centered on each FC pad, and assigning a global FC pad density score to each FC pad based on the number of FC pads located within the global grid area. Each FC pad having a global FC pad density score of less than a threshold global FC pad density score may be identified in the design data with a probable mechanical failure site.

The method may also include determining a dielectric area and a conductive area for each of the sub-areas of each of the number of layers, based on the x, y, z coordinates from the design data for any portions of the design elements that are located within each of the sub-areas in each of the number of layers of the chip carrier, 1140. The method may further include determining for each of the sub-areas of each of the number of layers of the chip carrier, an equivalent spring constant related to a first spring constant based on a first elastic modulus of the dielectric, the determined dielectric area, and a dielectric thickness from the z coordinate of the design data, and a second spring constant based on a second elastic modulus of the conductive material, the determined conductive area, and a conductive material thickness from the z coordinate of the design data, 1150. The conductive design elements from the design data may include any of a conductive plane, e.g., a voltage plane, a conductive signal line, e.g., a copper signal line, and a conductive via, e.g., a metal-filled via.

The method may also include accumulating each equivalent spring constant from each vertically aligned sub-area in each of the number of layers of the chip carrier, to provide a combined spring constant for each of the sub-areas of each of the number of layers for the chip carrier, 1160. The method may then further include mapping each of the combined spring constants onto the uniform square grid applied to the chip carrier, and identifying each FC pad that is located in a sub-area of the chip carrier which exceeds a threshold combined spring constant in the design data with a probable mechanical failure site, 1170.

For each of the sub-areas of the chip carrier design associated with and surrounding each FC pad identified as a probable mechanical failure site, the method may also include modifying the chip carrier design by decreasing a value of the combined spring constants for the sub-areas associated with and surrounding each of the FC pads identified as a probable mechanical failure site, to reduce a stiffness of the chip, 1180.

Decreasing a value of the combined spring constants, described by the method above, may be accomplished by decreasing an amount of a conductive area relative to an amount of a dielectric area in any of the sub-areas in any one of the layers of the chip carrier associated with and surrounding each FC pad identified with a probable mechanical failure site.

Alternatively, decreasing the value of the combined spring constants, described by the method above, may be accomplished by staggering a second location of a second via in a second layer, which is adjacent to a first layer, relative to a first location of a first via in the first layer in any of said sub-areas associated with and surrounding each FC pad identified with a probable mechanical failure site.

The method may include determining a cumulative score for each of the sub-areas of each of the number of layers of the chip carrier, based on the location score, the local FC pad density score, and the combined spring constant, and identifying each FC pad that is located in a sub-area of the chip carrier which exceeds a threshold cumulative score in the design data with a probable mechanical failure site.

Additionally, the method may include determining gradients of the combined spring constants between each of the sub-areas and each of the sub-areas adjacent to each of the sub-areas in said uniform square grid. The method may further include assigning a maximal gradient score based on an absolute difference between each of the sub-areas and the sub-areas adjacent to each of the sub-areas. The method may yet further include identifying each FC pad that is located in a sub-area of the chip carrier, which exceeds a threshold maximal gradient score in the design data with a probable mechanical failure site.

As will be appreciated by one skilled in the art, aspects of the systems and methods herein may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 12:
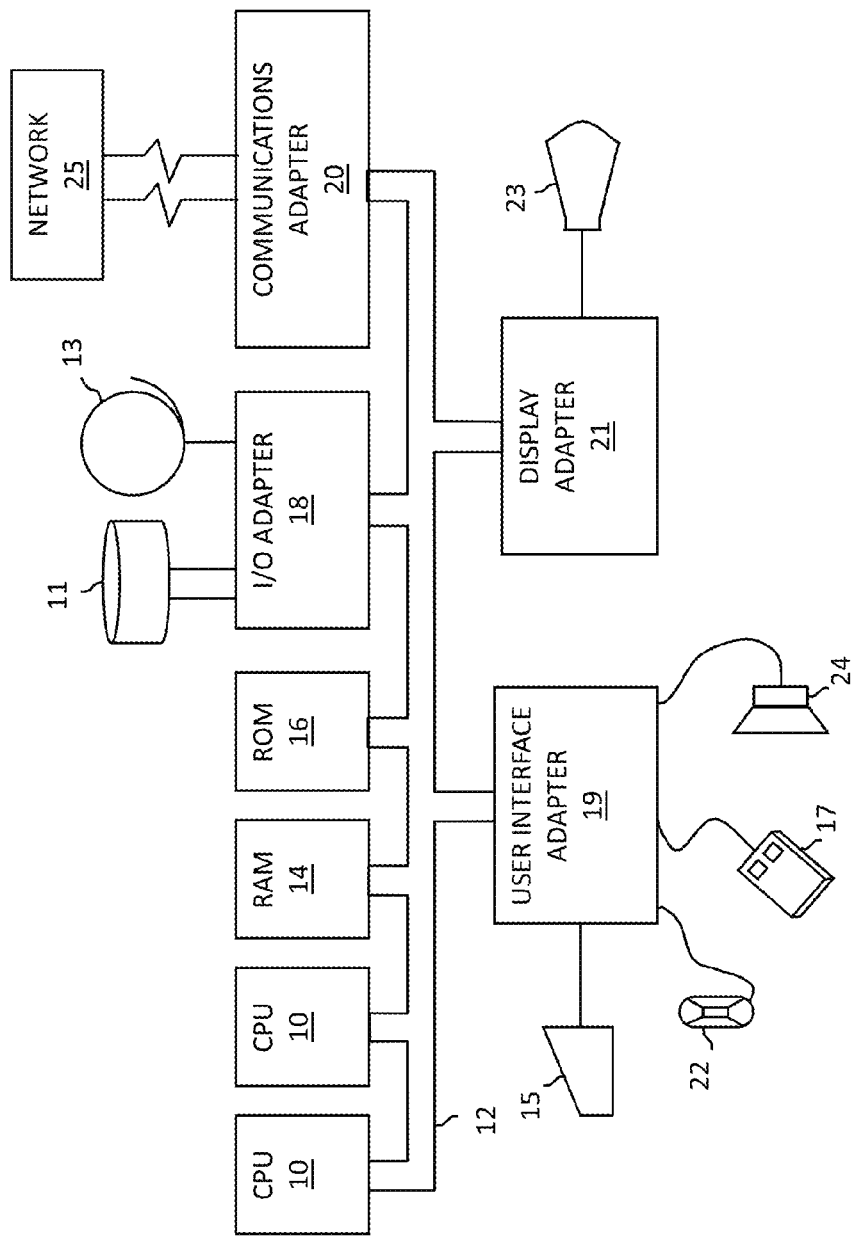
FIG. 12 is a schematic diagram of a hardware system in an exemplary embodiment.

A representative hardware environment for practicing the embodiments herein is depicted in FIG. 12. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The flowchart and block diagrams in the Figures illustrate the architecture, functionality, and operation of possible implementations of systems, methods and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Deployment Types include loading directly in the client, server and proxy computers via loading a storage medium such as a CD, DVD, etc. The process software may also be automatically or semi-automatically deployed into a computer system by sending the process software to a central server or a group of central servers. The process software is then downloaded into the client computers that will execute the process software. The process software is sent directly to the client system via e-mail. The process software is then either detached to a directory or loaded into a directory by a button on the e-mail that executes a program that detaches the process software into a directory. Send the process software directly to a directory on the client computer hard drive. When there are proxy servers, the process will, select the proxy server code, determine on which computers to place the proxy servers' code, transmit the proxy server code, and then install the proxy server code on the proxy computer. The process software will be transmitted to the proxy server then stored on the proxy server.

While it is understood that the process software may be deployed by manually loading directly in the client, server and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will, select the proxy server code, determine on which computers to place the proxy servers' code, transmit the proxy server code, then install the proxy server code on the proxy computer. The process software will be transmitted to the proxy server then stored on the proxy server.

Figure 13:
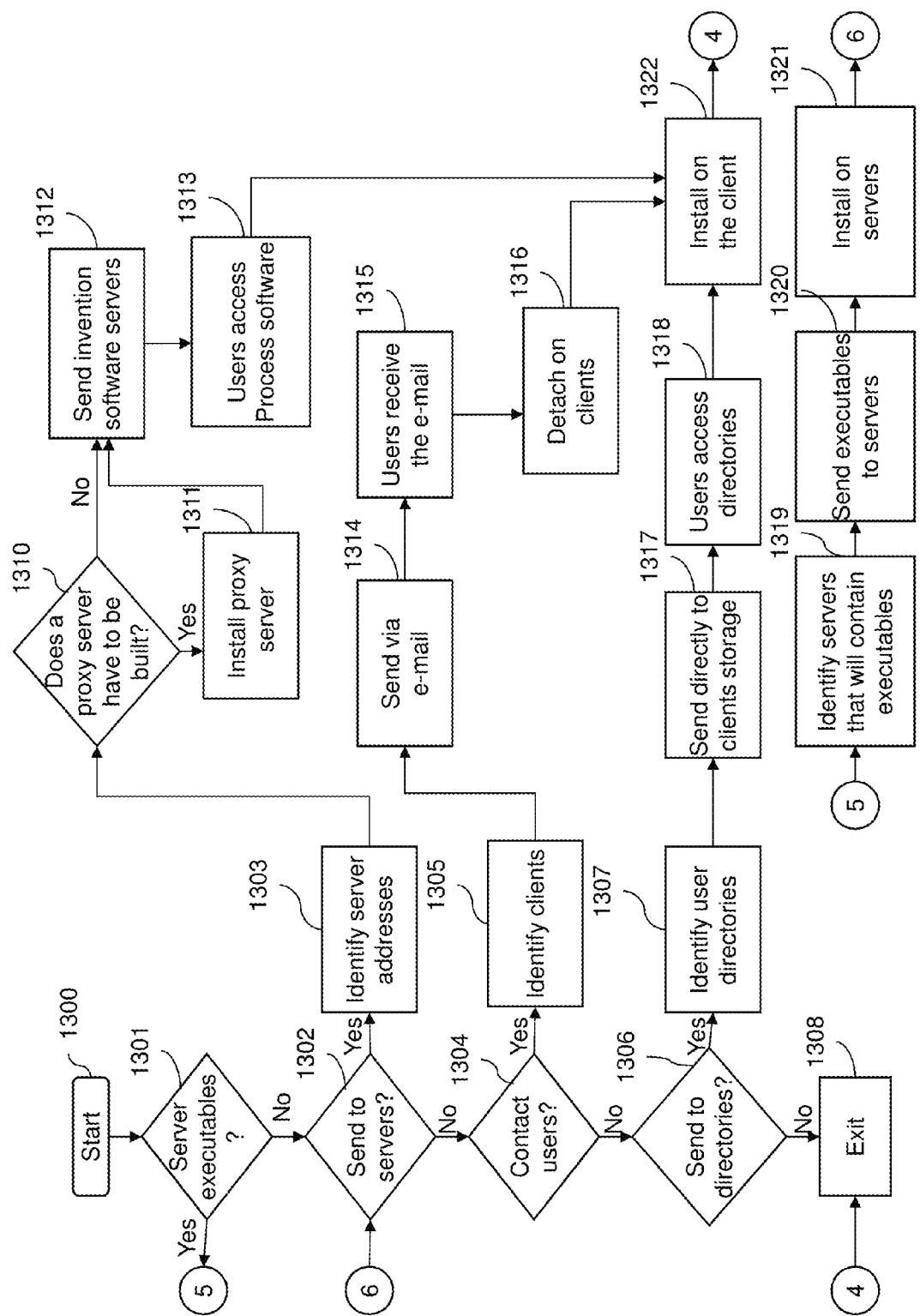
FIG. 13 is a schematic diagram of a deployment system in an exemplary embodiment.

In FIG. 13, Step 1300 begins the deployment of the process software. The first thing is to determine if there are any programs that will reside on a server or servers when the process software is executed 1301. If this is the case then the servers that will contain the executables are identified 1319. The process software for the server or servers is transferred directly to the servers' storage via FTP or some other protocol or by copying though the use of a shared file system 1320. The process software is then installed on the servers 1321.

Next, a determination is made on whether the process software is be deployed by having users access the process software on a server or servers 1302. If the users are to access the process software on servers then the server addresses that will store the process software are identified 1303.

A determination is made if a proxy server is to be built 1310 to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required then the proxy server is installed 1310. The process software is sent to the servers either via a protocol such as FTP or it is copied directly from the source files to the server files via file sharing 1312. Another embodiment would be to send a transaction to the servers that contained the process software and have the server process the transaction, then receive and copy the process software to the server's file system. Once the process software is stored at the servers, the users via their client computers, then access the process software on the servers and copy to their client computers file systems 1313. Another embodiment is to have the servers automatically copy the process software to each client and then run the installation program for the process software at each client computer. The user executes the program that installs the process software on his client computer 1322 then exits the process 1308.

In step 1304 a determination is made whether the process software is to be deployed by sending the process software to users via e-mail. The set of users where the process software will be deployed are identified together with the addresses of the user client computers 1305. The process software is sent via e-mail to each of the users' client computers. The users then receive the e-mail 1315 and then detach the process software from the e-mail to a directory on their client computers 1316. The user executes the program that installs the process software on his client computer 1322 then exits the process 1308.

Lastly a determination is made on whether to the process software will be sent directly to user directories on their client computers 1306. If so, the user directories are identified 1307. The process software is transferred directly to the user's client computer directory 1317. This can be done in several ways such as but not limited to sharing of the file system directories and then copying from the sender's file system to the recipient user's file system or alternatively using a transfer protocol such as File Transfer Protocol (FTP). The users access the directories on their client file systems in preparation for installing the process software 1318. The user executes the program that installs the process software on his client computer 1322 then exits the process 1308.

The process software is integrated into a client, server and network environment by providing for the process software to coexist with applications, operating systems and network operating systems software and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists matches the parameter lists required by the process software. Conversely parameters passed by the software applications to the process software will be checked to ensure the parameters match the parameters required by the process software. The client and server operating systems including the network operating systems will be identified and compared to the list of operating systems, version numbers and network software that have been tested to work with the process software. Those operating systems, version numbers and network software that do not match the list of tested operating systems and version numbers will be upgraded on the clients and servers to the required level.

After ensuring that the software, where the process software is to be deployed, is at the correct version level that has been tested to work with the process software, the integration is completed by installing the process software on the clients and servers.

Figure 14:
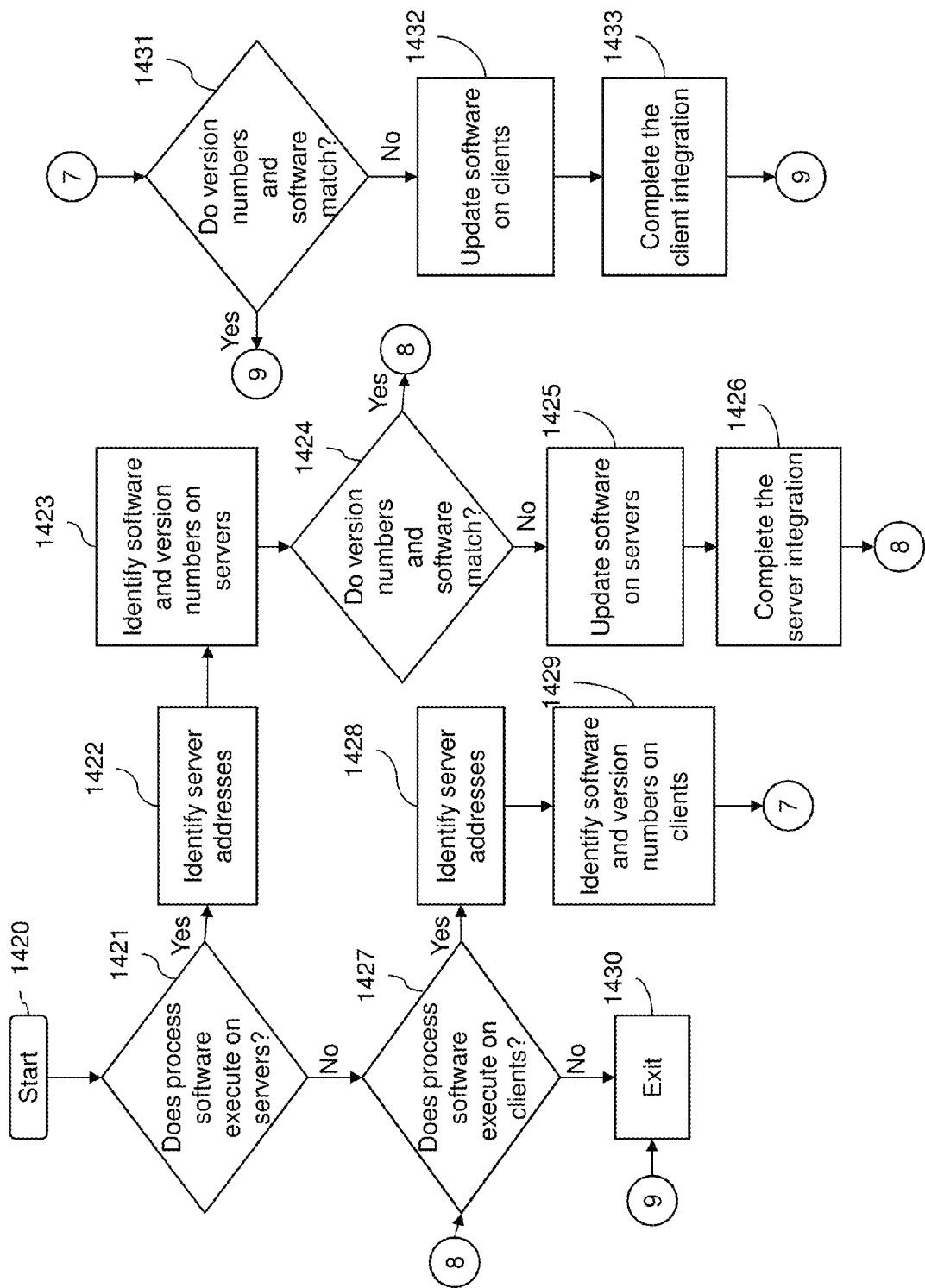
FIG. 14 is a schematic diagram of an integration system in an exemplary embodiment.

In FIG. 14, Step 1420 begins the integration of the process software. The first thing is to determine if there are any process software programs that will execute on a server or servers 1421. If this is not the case, then integration proceeds to 1427. If this is the case, then the server addresses are identified 1422. The servers are checked to see if they contain software that includes the operating system (OS), applications, and network operating systems (NOS), together with their version numbers, that have been tested with the process software 1423. The servers are also checked to determine if there is any missing software that is required by the process software 1423.

A determination is made if the version numbers match the version numbers of OS, applications and NOS that have been tested with the process software 1424. If all of the versions match and there is no missing required software the integration continues in 1427.

If one or more of the version numbers do not match, then the unmatched versions are updated on the server or servers with the correct versions 1425. Additionally if there is missing required software, then it is updated on the server or servers 1425. The server integration is completed by installing the process software 1426.

Step 1427 which follows either 1421, 1424 or 1426 determines if there are any programs of the process software that will execute on the clients. If no process software programs execute on the clients the integration proceeds to 1430 and exits. If this not the case, then the client addresses are identified 1428.

The clients are checked to see if they contain software that includes the operating system (OS), applications, and network operating systems (NOS), together with their version numbers that have been tested with the process software 1429. The clients are also checked to determine if there is any missing software that is required by the process software 1429.

A determination is made as to whether the version numbers match the version numbers of OS, applications and NOS that have been tested with the process software 1431. If all of the versions match and there is no missing required software, then the integration proceeds to 1430 and exits.

If one or more of the version numbers do not match, then the unmatched versions are updated on the clients with the correct versions 1432. In addition, if there is missing required software then it is updated on the clients 1432. The client integration is completed by installing the process software on the clients 1433. The integration proceeds to 1430 and exits.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally the assessed server may make requests of other servers that require CPU units. CPU units are an example that represents but one measurement of use. Other measurements of use include but are not limited to network bandwidth, memory usage, storage usage, packet transfers, complete transactions etc. When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to effect the performance of that server, other servers are accessed to increase the capacity and to share the workload. Likewise when other measurements of use such as network bandwidth, memory usage, storage usage, etc. approach a capacity so as to effect performance, additional network bandwidth, memory usage, storage etc. are added to share the workload. The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider. In another embodiment, the service provider requests payment directly from a customer account at a banking or financial institution. In another embodiment, if the service provider is also a customer of the customer that uses the process software application, the payment owed to the service provider is reconciled to the payment owed by the service provider to minimize the transfer of payments.

The process software is shared, simultaneously serving multiple customers in a flexible, automated fashion. It is standardized, requiring little customization and it is scalable, providing capacity on demand in a pay as-you-go model.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally the assessed server may make requests of other servers that require CPU units. CPU units are an example that represents but one measurement of use. Other measurements of use include but are not limited to network bandwidth, memory usage, storage usage, packet transfers, complete transactions etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to effect the performance of that server, other servers are accessed to increase the capacity and to share the workload. Likewise when other measurements of use such as network bandwidth, memory usage, storage usage, etc. approach a capacity so as to effect performance, additional network bandwidth, memory usage, storage etc. are added to share the workload.

The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider.

In another embodiment, the service provider requests payment directly from a customer account at a banking or financial institution.

In another embodiment, if the service provider is also a customer of the customer that uses the process software application, the payment owed to the service provider is reconciled to the payment owed by the service provider to minimize the transfer of payments.

Figure 15:
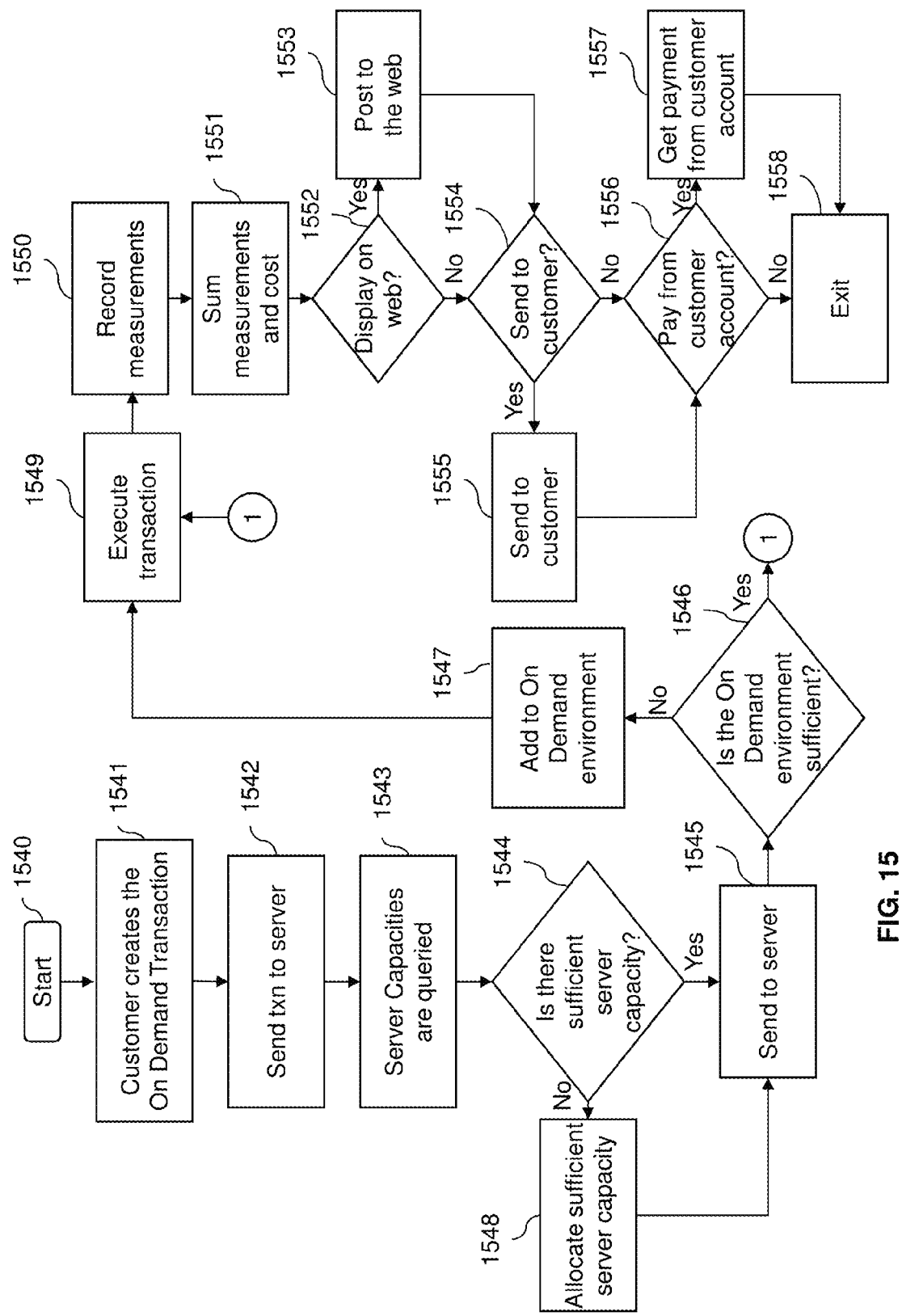
FIG. 15 is a schematic diagram of an on demand system in an exemplary embodiment.

In FIG. 15, Step 1540 begins the On Demand process. A transaction is created than contains the unique customer identification, the requested service type and any service parameters that further specify the type of service 1541. The transaction is then sent to the main server 1542. In an On Demand environment the main server can initially be the only server, then as capacity is consumed other servers are added to the On Demand environment.

The server central processing unit (CPU) capacities in the On Demand environment are queried 1543. The CPU requirement of the transaction is estimated, then the servers available CPU capacity in the On Demand environment are compared to the transaction CPU requirement to see if there is sufficient CPU available capacity in any server to process the transaction 1544. If there is not sufficient server CPU available capacity, then additional server CPU capacity is allocated to process the transaction 1548. If there was already sufficient Available CPU capacity then the transaction is sent to a selected server 1545.

Before executing the transaction, a check is made of the remaining On Demand environment to determine if the environment has sufficient available capacity for processing the transaction. This environment capacity consists of such things as but not limited to network bandwidth, processor memory, storage etc. 1546. If there is not sufficient available capacity, then capacity will be added to the On Demand environment 1547. Next the required software to process the transaction is accessed, loaded into memory, then the transaction is executed 1549.

The usage measurements are recorded 1550. The usage measurements consists of the portions of those functions in the On Demand environment that are used to process the transaction. The usage of such functions as, but not limited to, network bandwidth, processor memory, storage and CPU cycles are what is recorded. The usage measurements are summed, multiplied by unit costs and then recorded as a charge to the requesting customer 1551. If the customer has requested that the On Demand costs be posted to a web site 1552 then they are posted 1553.

If the customer has requested that the On Demand costs be sent via e-mail to a customer address 1554 then they are sent 1555. If the customer has requested that the On Demand costs be paid directly from a customer account 1556 then payment is received directly from the customer account 1557. The last step is exit the On Demand process.

The process software may be deployed, accessed and executed through the use of a virtual private network (VPN), which is any combination of technologies that can be used to secure a connection through an otherwise unsecured or untrusted network. The use of VPNs is to improve security and for reduced operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee.

The process software may be deployed, accessed and executed through either a remote-access or a site-to-site VPN. When using the remote-access VPNs the process software is deployed, accessed and executed via the secure, encrypted connections between a company's private network and remote users through a third-party service provider. The enterprise service provider (ESP) sets a network access server (NAS) and provides the remote users with desktop client software for their computers. The telecommuters can then dial a toll-free number or attach directly via a cable or DSL modem to reach the NAS and use their VPN client software to access the corporate network and to access, download and execute the process software.

When using the site-to-site VPN, the process software is deployed, accessed and executed through the use of dedicated equipment and large-scale encryption that are used to connect a company's multiple fixed sites over a public network such as the Internet.

The process software is transported over the VPN via tunneling which is the process of placing an entire packet within another packet and sending it over a network. The protocol of the outer packet is understood by the network and both points, called tunnel interfaces, where the packet enters and exits the network.

Figure 16:
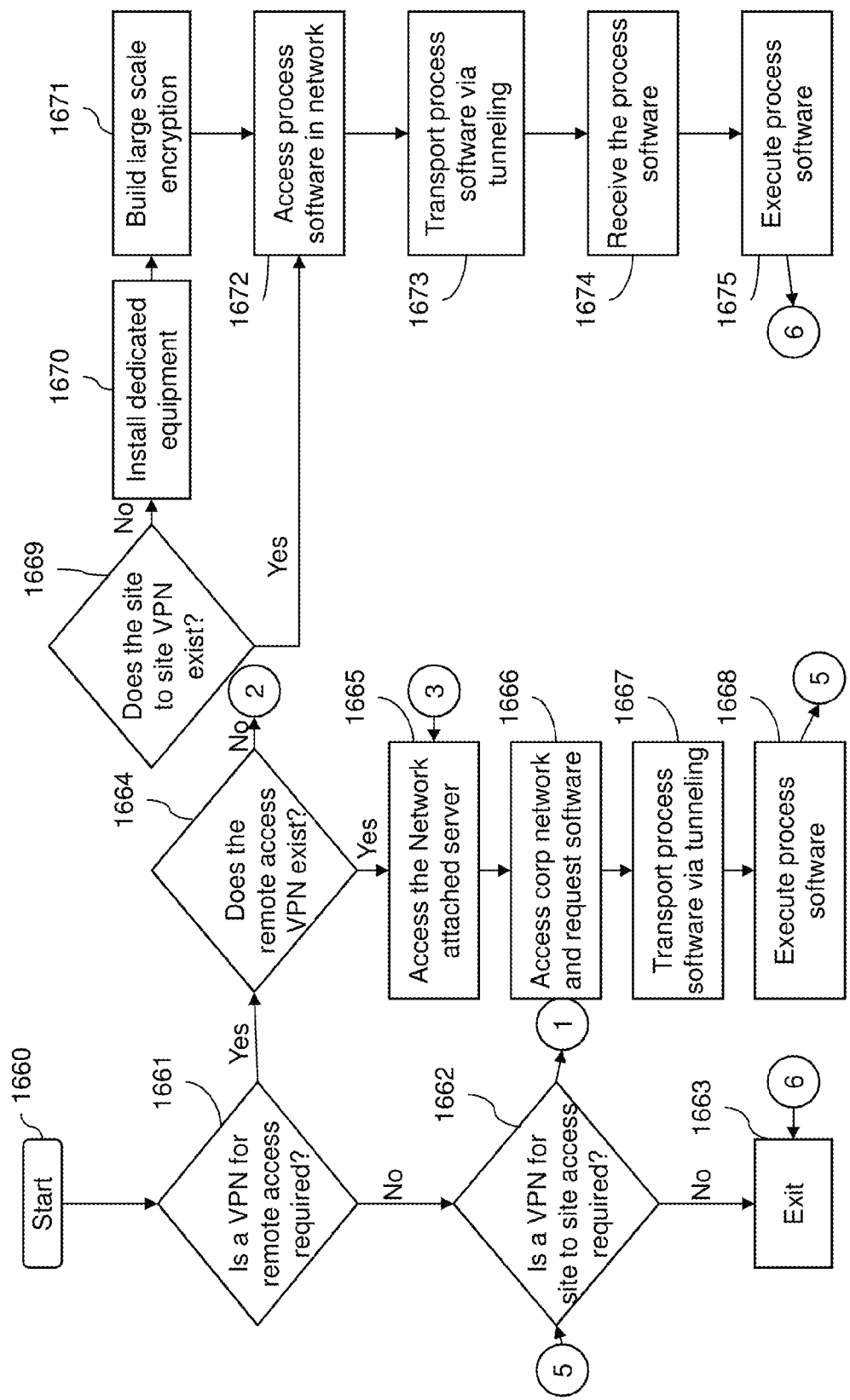
FIG. 16 is a schematic diagram of a virtual private network system in an exemplary embodiment.
Figure 17:
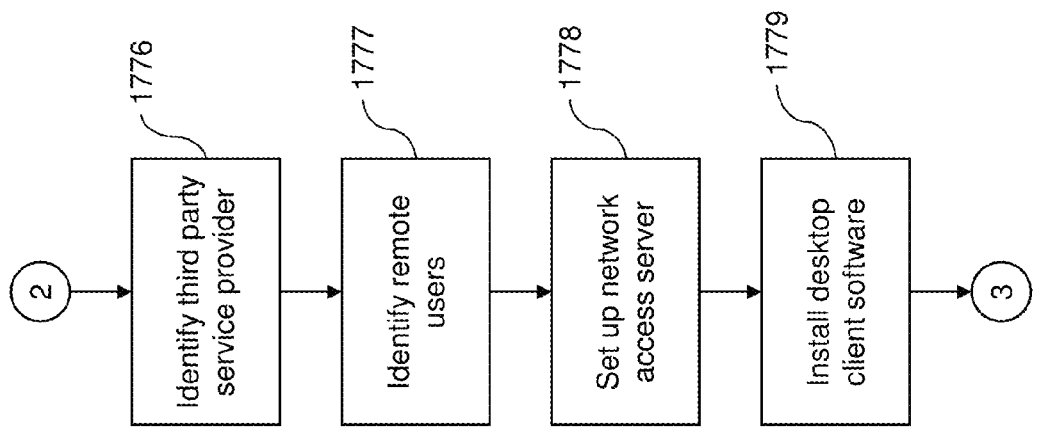
FIG. 17 is a schematic diagram of a virtual private network system in an exemplary embodiment.

In FIGS. 16 and 17, Step 1660 begins the Virtual Private Network (VPN) process. A determination is made to see if a VPN for remote access is required 1661. If it is not required, then proceed to 1662. If it is required, then determine if the remote access VPN exists 1664.

If it does exist, then proceed to 1665. Otherwise identify the third party provider that will provide the secure, encrypted connections between the company's private network and the company's remote users 1776. The company's remote users are identified 1777. The third party provider then sets up a network access server (NAS) 1778 that allows the remote users to dial a toll free number or attach directly via a cable or DSL modem to access, download and install the desktop client software for the remote-access VPN 1779.

After the remote access VPN has been built or if it been previously installed, the remote users can then access the process software by dialing into the NAS or attaching directly via a cable or DSL modem into the NAS 1665. This allows entry into the corporate network where the process software is accessed 1666. The process software is transported to the remote user's desktop over the network via tunneling. That is the process software is divided into packets and each packet including the data and protocol is placed within another packet 1667. When the process software arrives at the remote user's desktop, it is removed from the packets, reconstituted and then is executed on the remote users desktop 1668.

A determination is made to see if a VPN for site to site access is required 1662. If it is not required, then proceed to exit the process 1663. Otherwise, determine if the site to site VPN exists 1669. If it does exist, then proceed to 1672. Otherwise, install the dedicated equipment required to establish a site to site VPN 1670. Then build the large scale encryption into the VPN 1671.

After the site to site VPN has been built or if it had been previously established, the users access the process software via the VPN 1672. The process software is transported to the site users over the network via tunneling. That is the process software is divided into packets and each packet including the data and protocol is placed within another packet 1674. When the process software arrives at the remote user's desktop, it is removed from the packets, reconstituted and is executed on the site users desktop 1675. Proceed to exit the process 1663.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method for providing an elastic modulus map of a chip carrier of a flip chip package, said method comprising:

loading, by a computer, design data for said chip carrier of said flip chip package that includes x, y, z coordinates of all design elements disposed within each of a number of layers, which are disposed under flip chip (FC) pads, said design elements comprising any of a dielectric, a conductive plane, a conductive signal line, and a conductive via;

mapping, by said computer, a uniform square grid of sub-areas onto a plan view of each of said number of layers of said chip carrier, each of said sub-areas being defined by said x, y coordinates;

determining, by said computer, a dielectric area and a conductive area for each of said sub-areas of each of said number of layers, based on said design data for any portions of said design elements disposed within each of said sub-areas;

determining, by said computer, for each of said sub-areas of each of said number of layers, an equivalent spring constant related to a first spring constant based on a first elastic modulus of said dielectric, said dielectric area, and a dielectric thickness from said z coordinate of said design data, and a second spring constant based on a second elastic modulus of said conductive material, said conductive area, and a conductive material thickness from said z coordinate of said design data;

accumulating, by said computer, each equivalent spring constant from each vertically aligned sub-area in each of said number of layers, to provide a combined spring constant for each of said sub-areas of said chip carrier; and mapping, by said computer, each of said combined spring constants onto said uniform square grid of said chip carrier, to provide said elastic modulus map.

2. The method of claim 1, said number of layers comprising at least 4 layers.

3. The method of claim 1, each of said FC pads being centered on a 2×2 grid of 4 sub-areas of said chip carrier.

4. The method of claim 1, each of said FC pads more being centered on a 3×3 grid of 9 sub-areas of said chip carrier.

5. The method of claim 1, said conductive via comprising any of a through hole via, a micro-via, a blind via, and a filled drill hole.

* * * * *